United States Patent
Nagarkar et al.

(10) Patent No.: US 10,033,152 B1
(45) Date of Patent: Jul. 24, 2018

(54) CORROSION RESISTANT ANTIREFLECTION COATING AND FABRICATION METHOD THEREOF

(71) Applicants: Vivek V. Nagarkar, Weston, MA (US); Zsolt Marton, Watertown, MA (US); Harish B. Bhandari, Brookline, MA (US)

(72) Inventors: Vivek V. Nagarkar, Weston, MA (US); Zsolt Marton, Watertown, MA (US); Harish B. Bhandari, Brookline, MA (US)

(73) Assignee: RADIATION MONITORING DEVICES, INC., Watertown, MA (US)

( * ) Notice: Subject to any disclaimer, the term of this patent is extended or adjusted under 35 U.S.C. 154(b) by 240 days.

(21) Appl. No.: 14/850,177

(22) Filed: Sep. 10, 2015

Related U.S. Application Data

(60) Provisional application No. 62/052,180, filed on Sep. 18, 2014.

(51) Int. Cl.
 *H01S 5/028* (2006.01)
 *C23C 14/22* (2006.01)
 *C23C 14/00* (2006.01)

(52) U.S. Cl.
 CPC ............ *H01S 5/028* (2013.01); *C23C 14/221* (2013.01)

(58) Field of Classification Search
 CPC ........................................................ H01S 5/028
 USPC ............................................................. 428/448
 See application file for complete search history.

(56) References Cited

PUBLICATIONS

Yang et al; Selective absorbing coating—heat collector; Dec. 2014; Yunnan Normal University, Peop. Rep. China; Chem Abstract 163: 53820 (1 of 1 CAPLUS in 14/850177 STN-CPC).*

* cited by examiner

*Primary Examiner* — Duc Truong
(74) *Attorney, Agent, or Firm* — Burns & Levinson LLP; Orlando Lopez

(57) ABSTRACT

An antireflective structure and a fabrication method thereof are disclosed. In one aspect, the antireflective structure includes a substrate, a buffer layer on the substrate, and an anticorrosion layer on the buffer layer, wherein the corrosion resistant layer comprises a densely packed cubic lattice structure. In one aspect, the fabrication method includes depositing a first buffer layer on a substrate in an e-beam deposition process, and depositing a first anticorrosion layer on the first buffer layer in an e-beam deposition process, wherein the substrate comprises sapphire, the first corrosion resistant layer comprises lutetia, and the first buffer layer comprise silicon carbide.

7 Claims, 3 Drawing Sheets

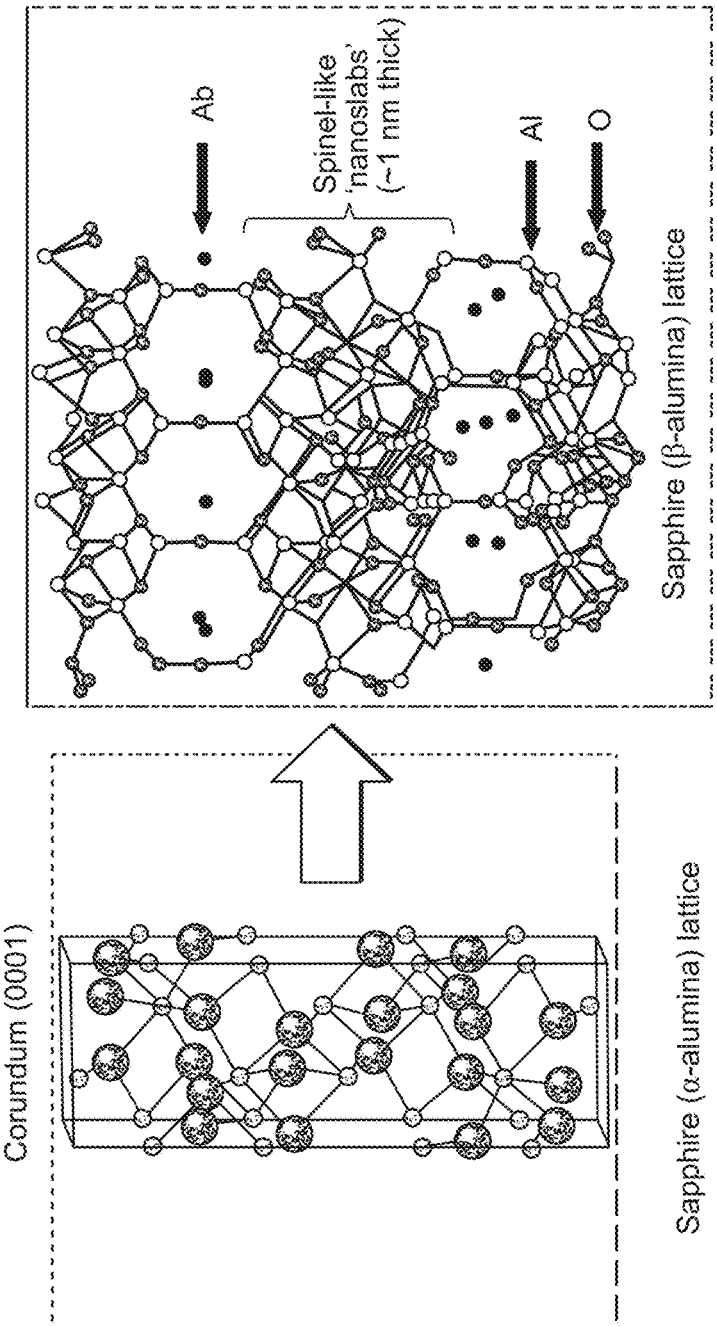
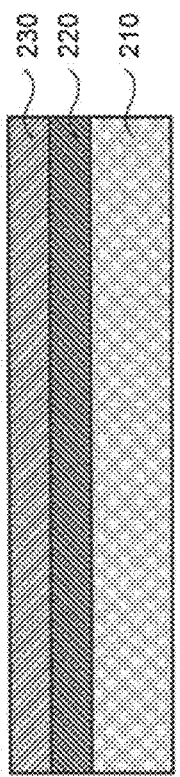
FIG. 1
FIG. 2

CORROSION RESISTANT ANTIREFLECTION COATING AND FABRICATION METHOD THEREOF

CROSS REFERENCE TO RELATED APPLICATIONS

This application claims priority to and benefit of U.S. Provisional Application No. 62/052,180, entitled CORROSION RESISTANT ANTIREFLECTION COATING AND FABRICATION METHOD THEREOF, filed on Sep. 18, 2014, which is incorporated by reference herein in its entirety and for all purposes.

STATEMENT REGARDING FEDERALLY SPONSORED RESEARCH OR DEVELOPMENT

This invention was made with government support under Grant No. HQ0147-13-C-7385 P001 awarded by Missile Defense Agency. The federal government has certain rights in the invention.

BACKGROUND

The present teachings relate to an antireflection coating and a fabrication method thereof. More particularly, the present teachings relate to an antireflection coating that is corrosion resistant and a fabrication method thereof.

Diode pumped alkali lasers (DPAL) have been introduced and improved in the past decade, leading to the development of higher power DPALS with demonstrated power increase from a few milli-Watts to several hundred Watts. As power increases, optical damage to the sapphire window of DPAL has become a serious problem.

Deposits have been observed on the window coincident with the location of the laser beam. If the laser system is not turned off soon after the deposits appear, increased absorption can lead to catastrophic window failure. In addition, anti-reflection (AR) coatings that have been used to reduce the surface reflection have been found to rapidly degrade in the alkali environment, accelerating the aforementioned failure. Although the origin of the failure has not yet been fully understood, it appears that the failure comes about from a combination of the alkali vapor and the laser radiation. Two possible mechanisms are that (1) the laser light may be producing excited state rubidium, which is more aggressively attacking the windows, and that (2) the laser is heating the windows to a high temperature, accelerating the chemical reaction rates between the alkali and the window substrate.

Therefore, there is a need to develop new optical coating and substrate that are economic, durable, and manufacturable, so as to advance the state of the art in high-performance lasers.

SUMMARY

In view of the above, one objective of the present teachings is to develop specialized coatings based on refractory materials for the protection of high power density laser components that are otherwise exposed to highly corrosive, high temperature (500° C.), high pressure (10-20 atmosphere), Rubidium vapor and helium gas mixtures. The multi-layer anti-reflective (AR) coating of the present teachings minimizes reflection of the characteristic 780 nm D1 and 795 nm D2 wavelengths of Rb vapor to <0.01%, allowing 99.99% transmission of the laser power. The refractory nature and excellent optical performance of the coatings allows the coatings to withstand the anticipated high power densities of 40 kW/cm$^2$, without damage or failure.

The coatings of the present teachings offers the following features: (i) resistance to Rb(vapor)-He(gas) mixtures at a temperature of about 500° C. and at laser intensities ≥40 kW/cm$^2$, without being damaged or otherwise failing; (ii) resistance to rubidium oxides and hydroxides; (iii) resistance to the contamination and the presence of 100 μm class particles at a temperature of about 500° C. and laser intensities ≥40 kW/cm$^2$; (iv) transmission ≥99.99% at the D1 (~780 nm) and D2 (~795 nm) wavelengths of Rb; and (v) applicability to suitable substrates, for example, sapphire, with window dimensions ranging from about 2.5×2.5 cm$^2$ to over 10×10 cm$^2$.

Desired coatings are realized using a refractory material of lutetium oxide (Lu$_2$O$_3$), whose high density (9.5 g/cc) and cubic structure act as an effective barrier for penetrating corrosive Rb ions. To realize the desired optical performance, in one embodiment, an AR structure of the present teachings comprises alternating layers of Lu$_2$O$_3$ and silicon carbide (SiC), which are deposited using e-beam evaporation technique. SiC is known as a hard material, whose structure matches with sapphire, the window material used in Diode Pumped Alkali Laser Systems (DPALS) and similar systems. Preliminary simulation suggests that even a single bilayer pair of SiC and Lu$_2$O$_3$ can provide a reflectance of <0.1%, which can be further reduced to achieve the desired goal of <0.01% reflectance. Alternatively, sesquioxides, such as yttrium oxide (Y$_2$O$_3$), also provide the required refractive index match while maintaining chemical and structural compatibility and minimizing stresses in the deposited coatings.

In accordance with one aspect, the present teachings provide an antireflective coating. The antireflective structure includes a substrate, a buffer layer on the substrate, and an anticorrosion layer on the buffer layer, wherein the corrosion resistant layer comprises a densely packed cubic lattice structure.

In accordance with one aspect, the present teachings provide a method for fabricating an antireflective coating. The method includes depositing a first buffer layer on a substrate in an e-beam deposition process, and depositing a first anticorrosion layer on the first buffer layer in an e-beam deposition process, wherein the substrate comprises sapphire, the first corrosion resistant layer comprises lutetia, and the first buffer layer comprise silicon carbide.

BRIEF DESCRIPTION OF THE DRAWINGS

The present disclosure is to be read in conjunction with the accompanying drawings, in which:

FIG. 1 schematically illustrates the corrosion mechanism of sapphire as Rb ions tunnel into the porous lattice of the sapphire substrate;

FIG. 2 illustrates a substrate comprising antireflection coatings in accordance with an embodiment of the present teachings;

DETAILED DESCRIPTION

Figure 3:
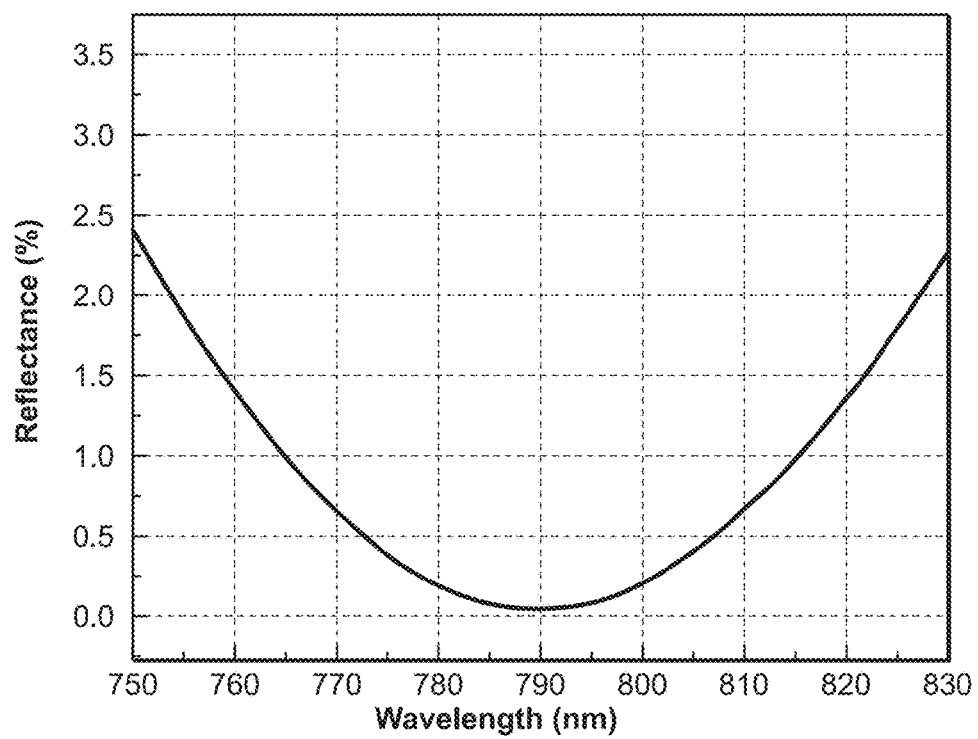
FIG. 3 illustrates a simulated reflectance curve for a sapphire substrate having a Lu$_2$O$_3$ layer (about 84.2 nm thick) and a SiC layer (about 252 nm thick) coated thereon, showing a reflectance of less than 0.1% at 780 nm and 795 nm, in accordance with an embodiment of the present teachings.

The following detailed description presents the currently contemplated modes of carrying out these teachings. The description is not to be taken in a limiting sense, but is made merely for the purpose of illustrating the general principles of these teachings, since the scope of these teachings is best defined by the appended claims.

As used herein, the singular forms "a," "an," and "the" include the plural reference unless the context clearly dictates otherwise.

Except where otherwise indicated, all numbers expressing quantities of ingredients, reaction conditions, and so forth used in the specification and claims are to be understood as being modified in all instances by the term "about."

FIG. 1 schematically illustrates the corrosion mechanism of sapphire as rubidium (Rb) ions tunnel into the porous lattice of the sapphire substrate. As shown in FIG. 1, sapphire has a marginally dense corundum structure, which is a hexagonal lattice ($\alpha$-$Al_2O_3$, R3c). In a corrosive Rb(vapor) environment, the sapphire crystal structure reacts with the alkali (e.g., Rb) ions, which leads to rapid diffusion of rubidium into the sapphire crystal structure to form spinel-like nanoslabs, thereby resulting in a new type of crystal configuration, so-called "$\alpha$-alumina." Once such nanoslab structures are formed, the lattice becomes even more porous and thus more susceptible to corrosion. This phase is not only crystallographically different from the host, but also exhibits a much larger ionic conductivity that promotes further alkali diffusion. The continued diffusion ultimately corrodes the entire wafer. To prevent this, the desired coating should have a highly dense/robust crystal structure.

FIG. 2 illustrates a substrate 210 comprising antireflection coatings 220 and 230 in accordance with an embodiment of the present teachings. As shown in FIG. 2, a buffer layer 220 is coated on a substrate 210, and a corrosion resistant layer 230 is coated on buffer layer 220. Although a single pair of corrosion resistant layer 230 and buffer layer 220 is shown on substrate 210, it is appreciated that multiple pairs of corrosion resistant layer 230 and buffer layer 220 may be formed on substrate 210.

In one embodiment, corrosion resistant layer 230 comprises refractory lutetia ($Lu_2O_3$), because lutetia ($Lu_2O_3$) has a densely packed cubic structure (Ia3), which serves as a non-permeable protection against the corrosive ions, and because its refractory nature maintains the crystal properties even under very high temperatures. Consequently, lutetia and its silicates are excellent coating materials capable of providing the necessary corrosion resistance in harsh environments. The hot-corrosion resistance of $Lu_2O_3$ and its silicates has been tested in extreme sodium-containing (an alkali ion very similar to rubidium) atmospheres heated up to 1500° C. (See, for example, Shunkichi Ueno, et al., "Comparison of hot-corrosion behavior of $Al_2O_3$, $Lu_2O_3$ and their silicates," Journal of Ceramic Processing Research, Vol. 7, No. 3, pp. 201~205 (2006)). It has been shown that pure $Lu_2O_3$ coating is superior to its silicates, and in fact, it remained completely intact. This is a primary reason for choosing $Lu_2O_3$ as a top layer of the protective layer.

Besides corrosion resistance, the coating must fulfill strict optical performance requirements, such as ~0.1% or less reflectance and a challenging, extremely low, absorption on the order of 10 ppm for the Rb D1 (~780 nm) and D2 (~795 nm) wavelengths. Refractive indices of the (0001) oriented sapphire ($n_s$) and $Lu_2O_3$ ($n_l$) are considerably different for the two wavelengths (e.g., $n_s$=1.752 and $n_l$=1.919). As such, buffer layer 220 between substrate 210 and oxide layer 230 is necessary to minimize reflectance.

Preliminary computer modeling of various possible layered structures has been performed. Numerous buffer layer materials have been tried and calculations optimized for each by altering layer thickness until minimized reflectance is achieved. It appears that the employment of silicon-carbide (SiC) in conjunction with $Lu_2O_3$ yields a reflectance in the crucial wavelength range to be less than 0.1% for a single layered structure comprising a $Lu_2O_3$ layer (of about 82.4 nm thick) and a SiC layer (of about 252 nm thick), and when the SiC layer is formed on sapphire prior to $Lu_4O_3$ deposition. The simulated reflectance curve in the crucial wavelength region is shown in FIG. 3. Accordingly, in one embodiment, buffer layer 220 comprises silicon carbide (SiC).

Figure 4:
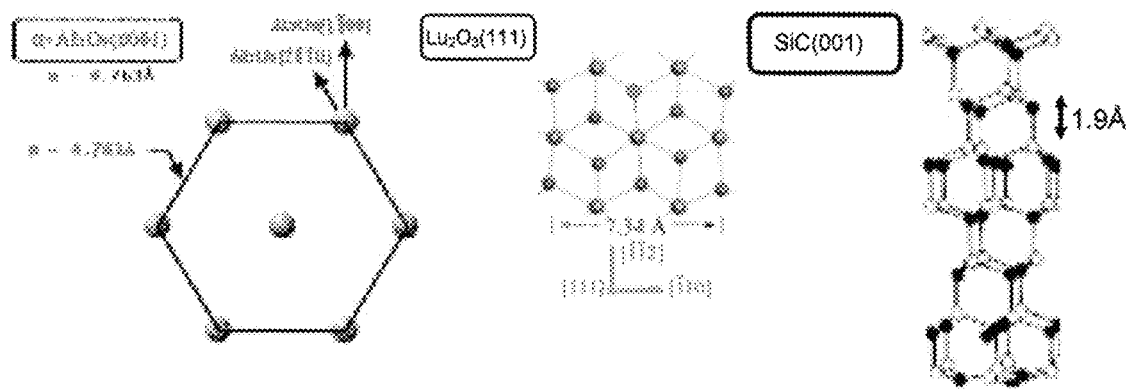
FIG. 4 schematically illustrates the lattice structure of sapphire (alumina), $Lu_2O_3$, and SiC, in accordance with an embodiment of the present teachings.

FIG. 4 schematically illustrates the lattice structure of sapphire (alumina), $Lu_2O_3$, and SiC, in accordance with an embodiment of the present teachings. As shown, these are well-matched cubic structures, which fit well to form strong lattice bonds.

In one embodiment, an e-beam deposition process can be used to effectively deposit tightly controlled thickness of refractory materials, such as SiC and $Lu_2O_3$. For example, a uniform europium-doped $Lu_2O_3$ layer of several micrometers can be deposited on a large-area substrate (5×5 cm$^2$) by performing physical vapor deposition using an e-beam evaporation system.

1. The e-Beam Method.

E-beam evaporation is a physical vapor deposition method where an intense beam of high-energy electrons is utilized to evaporate a source material. Electrons are thermionically emitted from a hot tungsten filament and accelerated towards the source material via a very high potential difference. Thus, the electrons are accelerated into a target material, and upon collision generate enough energy density to cause localized melting and evaporation. The evaporant is then allowed to condense on a substrate, usually placed in the line of sight of the target material.

Figure 5:
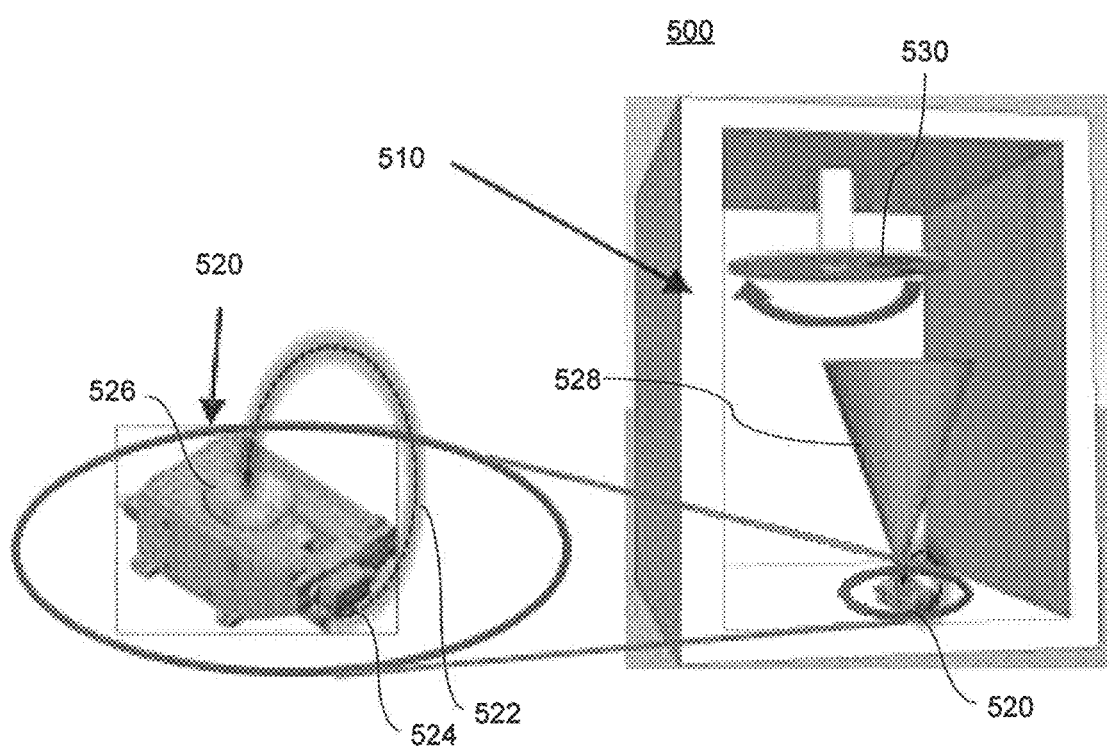
FIG. 5 illustrates a schematic diagram of an e-beam deposition system, in accordance with an embodiment of the present teachings.

FIG. 5 illustrates a schematic diagram of an e-beam deposition system 500, in accordance with an embodiment of the present teachings. As shown in FIG. 5, e-beam deposition system 500 comprises an e-beam chamber 510, an e-beam gun 520 in e-beam chamber 510, and a substrate holder 530 in e-beam chamber 510. A circular path of electron beam 522 is magnetically guided from cathode 524 to material reservoir 526. The electron beam 522 evaporates target material in reservoir 526, and the evaporated target material 528 is deposited to a substrate held by substrate holder 530. Substrate holder 530 may rotate the substrate during the deposition process.

In a typical case, one Ampere of emission electrons, accelerated through a 10 kV voltage drop, delivers an energy of 10 kW upon impact. Thus, this stream of electrons can melt and evaporate any material, provided the beam overcomes the heat losses associated with holding the material at high temperature. E-beams can be generated at high powers and with electron energies in the range of 5-30 kV. E-beam gun 520 can be built to produce up to 1200 kW of highly concentrated electron beam power. The energy from an electron is concentrated only on the surface of the target material, allowing the molten target material to be supported by a water-cooled copper hearth. In one embodiment, an e-beam system used for deposition of scintillator materials and protective coatings is rated at 3-14 kW, which offers high-rate deposition and excellent process control.

2. Directionality of Deposition.

The degree of vacuum in which electron beam processing is done is known as the region of free molecular flow. It is characterized by the fact that the residual gas or air molecules in the system are relatively low in number. Although gas molecules are confined to the bounding surfaces of the chamber, they rarely collide with each other. This phenomenon occurs in most e-beam systems whose absolute base pressure is less than 10-4 torr. Consequently, evaporated molecules reach the substrate without changing direction due to collisions with other molecules, resulting in a high degree of directionality in the deposition process.

3. High Rates of Evaporation and Thickness Control.

Evaporation rates respond rapidly to temperature changes. Beam positioning affects temperature, and is accomplished by changing the beam intensity and its cross-section. Magnetic controls are applied to alter not only the beam's cross-section, but also its raster across the target surface with high frequency, preventing sputtering and giving the operator complete control over the rate and distribution of evaporation. Quartz crystal monitors perform well with the e-beam system for closed-loop monitoring of evaporation rate. By sensing the evaporation or deposition rate, monitors can regulate power input to the source, which in turn regulates evaporation and deposition rates. Deposition rates as high as 25-50 micrometers per minute are achievable depending on the e-beam power and the source to substrate distance.

4. Density of Deposited Films and Minimization of Stress.

E-beam evaporation allows deposition rate control, which, along with substrate temperature control, e-beam chamber, e-beam gun allows deposition of films with density close to their material density. Generally, slower rates of deposition and high substrate temperatures are preferred for high-density coatings, and e-beam systems permit control of both parameters. Compared to the deposition rates on the order of 25-50 micrometers per minute that e-beam systems may afford, the target is to achieve highly uniform and high-density growth of the deposited materials. Consequently, slower growth rates on the order of 200 to 300 nm/min and high substrate temperature through quartz lamp heaters are maintained during deposition. Controlled deposition rates and in-situ annealing has beneficial effects for minimizing stresses in the resulting structure as well.

5. Uniformity of Coating.

Since the evaporated material flux density is radially symmetric relative to the point of impact of the e-beam on the source material, and the distance between the source and the substrate is relatively large, the process affords highly uniform coating thickness across the substrate deposition area. This allows fabrication of large-area gratings with minimal or no variations in the thicknesses of the multiple bi-layers.

6. High Purity of Films.

E-beam technique produces high-purity coatings with evaporation rates 100 to 1000 times higher than those attainable by alternate methods such as thermal evaporation and sputtering. This increases the proportion of evaporant molecules to contaminant molecules present in the vacuum chamber. Thus, it is possible to attain the same high purity coatings at $10^{-5}$ Torr as slower methods accomplish at $10^{-7}$ to $10^{-9}$ Torr. At pressures on the order of $10^{-5}$ Torr, it is possible to produce deposits that have less than one part per million impurity pickup from the vacuum environment.

7. In-Situ Ion Beam Etching: Control Delamination and Anisotropic Film Growth.

Commercial e-beam evaporators are normally equipped with ion guns or RF plasma sources for in-situ cleaning of substrates for improved adhesion. While such sources are not necessary for fundamental e-beam evaporation, they permit cleaning of substrates from organic residues prior to evaporation. Such residues are hard to remove even with the most aggressive cleaning protocols such as the RCA process, and often are the primary cause of delamination of surface coatings. In addition to cleaning the substrate prior to evaporation, the ion source may also be used to sputter-clean areas on the substrate where deposition is undesirable. This is a novel way of creating the highly anisotropic deposition that is required to realize the desired optical transmission and reflectivity requirements. Thus, the e-beam evaporation technique offers several key advantages that are critical for the successful growth of the SiC and $Lu_2O_3$ bilayer. These advantages include:

1) Well-established and proven technology—Minimizes risks;

2) High degree of directionality—Permits creation of the desired anisotropic bi-layer film stack structure on patterned substrates;

3) High rates of evaporation—Allows fabrication of multi layers in a reasonable time;

4) High density films—Controllable rates of evaporation and feasibility of substrate heating during evaporation permits deposition of films with density close to their material density;

5) In-situ annealing—Helps reduce stress in deposited thick structures;

6) Uniformity of coating thickness—Promotes a high degree of thickness uniformity over a large area, making it feasible to fabricate large gratings for human imaging;

7) High purity—Minimizes cross-contamination, creating corrosion resistant barrier between the Rb vapor and the sapphire substrate; and 8) In-situ ion beam etching—Improves film adhesion and removes material deposited on surfaces where deposition is undesirable.

In sum, the advantages of the present teachings include:

1) The dense lattice structure of $Lu_2O_3$ prevents corrosion from Rb vapor, their oxides and hydroxides, as well as be resistant to contamination and the presence of 100 μm class particles;

2) The refractive index matching between $Lu_2O_3$ and SiC-Sapphire, when deposited in appropriate thicknesses afforded by e-beam evaporation, provides transmission ≥99.99% at D1 (~780 nm) and D2 (~795 nm) wavelengths of Rb;

3) The excellent lattice matching between $Lu_2O_3$—SiC and Sapphire ensures strong coatings with excellent adhesion, enabling their use in the harsh environment of high energy Diode Pumped Alkali Laser Systems (DPALS); and 4) The temperature stability of both $Lu_2O_3$ and SiC permits their use in the anticipated temperature at about 500° C.

For the purposes of describing and defining the present teachings, it is noted that the term "substantially" is utilized herein to represent the inherent degree of uncertainty that may be attributed to any quantitative comparison, value, measurement, or other representation. The term "substantially" is also utilized herein to represent the degree by which a quantitative representation may vary from a stated reference without resulting in a change in the basic function of the subject matter at issue.

Although embodiments of the present teachings have been described in detail, it is to be understood that such embodiments are described for exemplary and illustrative purposes only. Various changes and/or modifications may be made by those skilled in the relevant art without departing from the spirit and scope of the present disclosure as defined in the appended claims.

What is claimed is:

1. An antireflective structure, comprising:
   a substrate;
   one or more layer pairs on the substrate, each of the layer pairs comprising:
   a buffer layer; and
   a corrosion resistant layer on the buffer layer, wherein the corrosion resistant layer comprises a densely packed cubic lattice structure; wherein the corrosion resistant layer comprises at least one of lutetia and silicates of lutetia.

2. The structure of claim 1, wherein the corrosion resistant layer comprises lutetia.

3. The structure of claim 1, wherein the substrate comprises sapphire.

4. An antireflective structure, comprising:
   a substrate;
   one or more layer pairs on the substrate, each of the layer pairs comprising:
   a buffer layer; and
   a corrosion resistant layer on the buffer layer, wherein the corrosion resistant layer comprises a densely packed cubic lattice structure; wherein the buffer layer comprises silicon carbide.

5. The antireflective structure of claim 1,
   wherein the one or more layer pairs comprise two or more layer pairs; and
   wherein the substrate comprises sapphire, the corrosion resistant layer comprises lutetia, and the buffer layer comprises silicon carbide.

6. A method for fabricating an antireflective structure, comprising:
   depositing a first buffer layer on a substrate in an e-beam deposition process; and
   depositing a first corrosion resistant layer on the first buffer layer in an e-beam deposition process;
   wherein the substrate comprises sapphire, the first corrosion resistant layer comprises lutetia, and the first buffer layer comprises silicon carbide.

7. The method of claim 6, further comprising:
   depositing a second buffer layer on the first corrosion resistant layer in an e-beam deposition process; and
   depositing a second corrosion resistant layer on the second buffer layer in an e-beam deposition process.

* * * * *